(12) United States Patent
Viswanathan et al.

(10) Patent No.: US 7,998,808 B2
(45) Date of Patent: Aug. 16, 2011

(54) SEMICONDUCTOR DEVICE FABRICATION USING SPACERS

(75) Inventors: Vijay Viswanathan, Apex, NC (US); Dev Alok Girdhar, Melbourne, FL (US); Timothy Henson, Torrance, CA (US); David Paul Jones, South Glamorgan (GB)

(73) Assignee: International Rectifier Corporation, El Segundo, CA (US)

( * ) Notice: Subject to any disclaimer, the term of this patent is extended or adjusted under 35 U.S.C. 154(b) by 94 days.

(21) Appl. No.: 12/409,077

(22) Filed: Mar. 23, 2009

(65) Prior Publication Data

US 2009/0263952 A1 Oct. 22, 2009

Related U.S. Application Data

(60) Provisional application No. 61/070,326, filed on Mar. 21, 2008.

(51) Int. Cl.
*H01L 21/8242* (2006.01)
*H01L 21/20* (2006.01)
H01L 21/76 (2006.01)

(52) U.S. Cl. . 438/243; 438/386; 438/427; 257/E21.549; 257/E21.651

(58) Field of Classification Search ................ 438/427, 438/222, 224, 243, 386, 270, 431, 437, 702; 257/E21.549, E21.651

See application file for complete search history.

(56) References Cited

U.S. PATENT DOCUMENTS

| | | | | |
|---|---|---|---|---|
| 4,495,025 A * | 1/1985 | Haskell | | 438/427 |
| 5,262,002 A * | 11/1993 | Grewal et al. | | 438/695 |
| 5,904,540 A * | 5/1999 | Sheng et al. | | 438/427 |
| 6,872,632 B2 * | 3/2005 | Ibara | | 438/427 |
| 6,998,666 B2 * | 2/2006 | Beintner et al. | | 257/301 |
| 7,638,409 B2 * | 12/2009 | Yoneda | | 438/424 |
| 7,671,441 B2 * | 3/2010 | Henson | | 257/500 |
| 2002/0171118 A1 * | 11/2002 | Mandelman et al. | | 257/510 |
| 2007/0138545 A1 * | 6/2007 | Lin et al. | | 438/270 |
| 2007/0138547 A1 * | 6/2007 | Nakamura | | 257/331 |
| 2007/0238251 A1 * | 10/2007 | Liau et al. | | 438/270 |
| 2008/0001214 A1 * | 1/2008 | Yamaoka et al. | | 257/328 |
| 2008/0153254 A1 * | 6/2008 | Yoneda | | 438/425 |
| 2009/0258467 A1 * | 10/2009 | Kim | | 438/270 |
| 2009/0263952 A1 * | 10/2009 | Viswanathan et al. | | 438/430 |
| 2010/0105188 A1 * | 4/2010 | Moens et al. | | 438/427 |
| 2011/0003458 A1 * | 1/2011 | Lee et al. | | 438/427 |

* cited by examiner

*Primary Examiner* — Walter L Lindsay, Jr.
(74) *Attorney, Agent, or Firm* — Farjami & Farjami LLP

(57) ABSTRACT

A process for fabrication of a semiconductor device that includes forming a first trench in a semiconductor body, forming spaced spacers in the first trench, and forming a narrower second trench at the bottom of the first trench using the spacers as a mask.

16 Claims, 15 Drawing Sheets

SEMICONDUCTOR DEVICE FABRICATION USING SPACERS

CROSS REFERENCE TO RELATED APPLICATION

This application is based on and claims benefit of U.S. Provisional Application Ser. No. 61/070,326, filed on Mar. 21, 2008, entitled SPACER TRENCH PROCESS FLOW, to which a claim of priority is hereby made and the disclosure of which is incorporated by reference.

BACKGROUND AND SUMMARY OF THE INVENTION

Mid-voltage (e.g. 30V-300V) trench type power MOSFETs that include insulated gate electrodes and an insulated source field electrode in a common trench are known. One problem of extending the mid-voltage design to lower drain voltages is the difficulty in forming the gate electrode adjacent to the source field electrode in the trench. Another problem is the difficulty in forming and then later etching the thinner oxide that insulates the source field electrode.

A method according to the present invention overcomes the difficulties outlined above by forming the common trench in a two-step trench etch process.

Specifically, a process according to the present invention includes forming a first trench mask, that may include a silicon nitride layer, over one surface of a semiconductor body, the first trench mask having an opening therein; removing semiconductor material from the semiconductor body from a bottom of the opening in the mask to obtain a first trench having a first width and extending to a first depth inside the semiconductor body, the first trench including sidewalls and a bottom; forming spacers inside the first trench, each spacer extending from the bottom of the first trench along a respective sidewall thereof, the spacers being spaced from one another at the bottom of the first trench; removing semiconductor from the bottom of the first trench using the spacers as a second trench mask to obtain a second trench having a second width and extending to a second depth below the first depth inside the semiconductor body, the second width being less than the first width, the second trench including sidewalls and a bottom; covering the sidewalls and the bottom of the second trench through, for example, oxidation of the same or deposition of a suitable insulation (e.g. deposition of silicon dioxide or some other suitable insulation body); and forming a field electrode inside the second trench, the source field electrode extending into the first trench.

In one embodiment, the spacers are comprised of silicon dioxide, which are then removed to allow for formation of insulated gate electrodes adjacent the source field electrode.

In another embodiment, the spacers are insulated gate electrodes.

A device fabricated according to the present invention can include a second trench having vertically oriented sidewalls or sidewalls that taper toward the bottom thereof.

In a process according to the present invention, the width and the depth of the first trench can be selected to optimize the spacer oxide etch, the gate electrode width and the desired figure of merits (FOMs). FOMs that are at least partially controlled by the gate depth and width are Rdson, gate charge, and breakdown voltage.

A method according to the present invention advantageously:

1) increases the process window for creating the gate electrode;
2) enables the formation of gate electrodes whose width can be easily controlled and defined by the trench etch process;
3) eliminates the need for multiple sacrificial oxide steps that will be required to form the gate electrodes; and
4) allows for better control of the Qgd, Qgs.

Other features and advantages of the present invention will become apparent from the following description of the invention which refers to the accompanying drawings.

DETAILED DESCRIPTION OF EMBODIMENTS OF THE INVENTION

Figure 1:
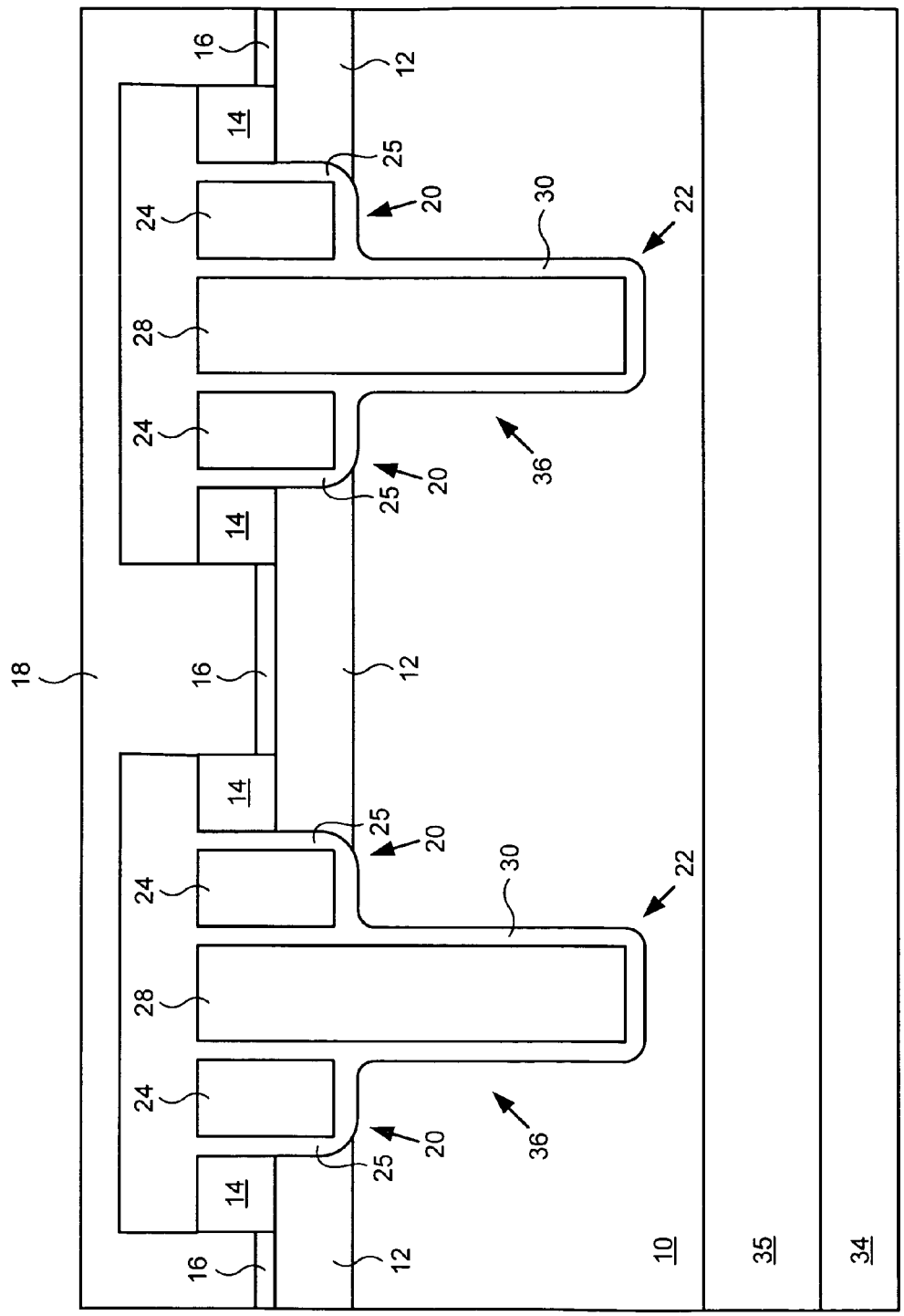
FIG. 1 illustrates a cross-sectional view of a power MOSFET fabricated according to the first embodiment.

Referring to FIG. 1, a power MOSFET according to the first embodiment of the present invention includes:

A) drift region 10 of one conductivity (e.g. N-type);
B) base region 12 of another conductivity (e.g. P-type) formed over drift region 10;
C) source regions 14 of the one conductivity formed over base region 12;
D) high conductivity contact regions 16 of another conductivity (e.g. P+) formed in base region 12, contact regions 16 having a lower resistivity than base region 12;
E) source contact/electrode 18 made of aluminum or the like in electrical contact with source regions 14 and high conductivity contact regions 16;
F) an insulated gate electrodes 20; and
G) a buried insulated source field electrodes 22.

Each insulated gate 20 includes a gate electrode 24 made from, for example, conductive polysilicon, which is insulated from base region 12 and a respective source region 14 by a gate oxide layer 25. Each insulated source field electrode 22 includes a source field electrode 28 made from, for example, conductive polysilicon, which is insulated from drift region 10 by an insulation body 30 (e.g. a silicon dioxide body) and insulated from gate electrode 24 by another insulation body (e.g. silicon dioxide body) interposed therebetween. Note that drift region 10 is formed of an epitaxial semiconductor body (e.g. silicon) and is disposed over a semiconductor substrate 35 (e.g. a silicon substrate) of the one conductivity, to which a drain contact/electrode 34 is ohmically coupled. Drain contact 34 may be formed from any suitable metallic materials such as aluminum or aluminum silicon.

A device fabricated according to the present invention includes a trench 36 for receiving insulated gates 20 as well as insulated source field electrodes 22. Thus, trench 36 includes a top portion in which insulated gates 20 reside and a bottom portion in which an insulated source field electrode 22 is received. Note that the top portion of trench 36 is wider than the bottom portion thereof, whereby trench 36 is generally T-shaped. Note further that insulated gates 20 are confined entirely in the top portion of trench 36 while each respective insulated source field electrode 22 extends from the bottom portion into the top portion of trench 36. It should be noted that the bottom portion of each trench 36 extends deeper into drift region 10 than the top portion thereof.

Figure 2:
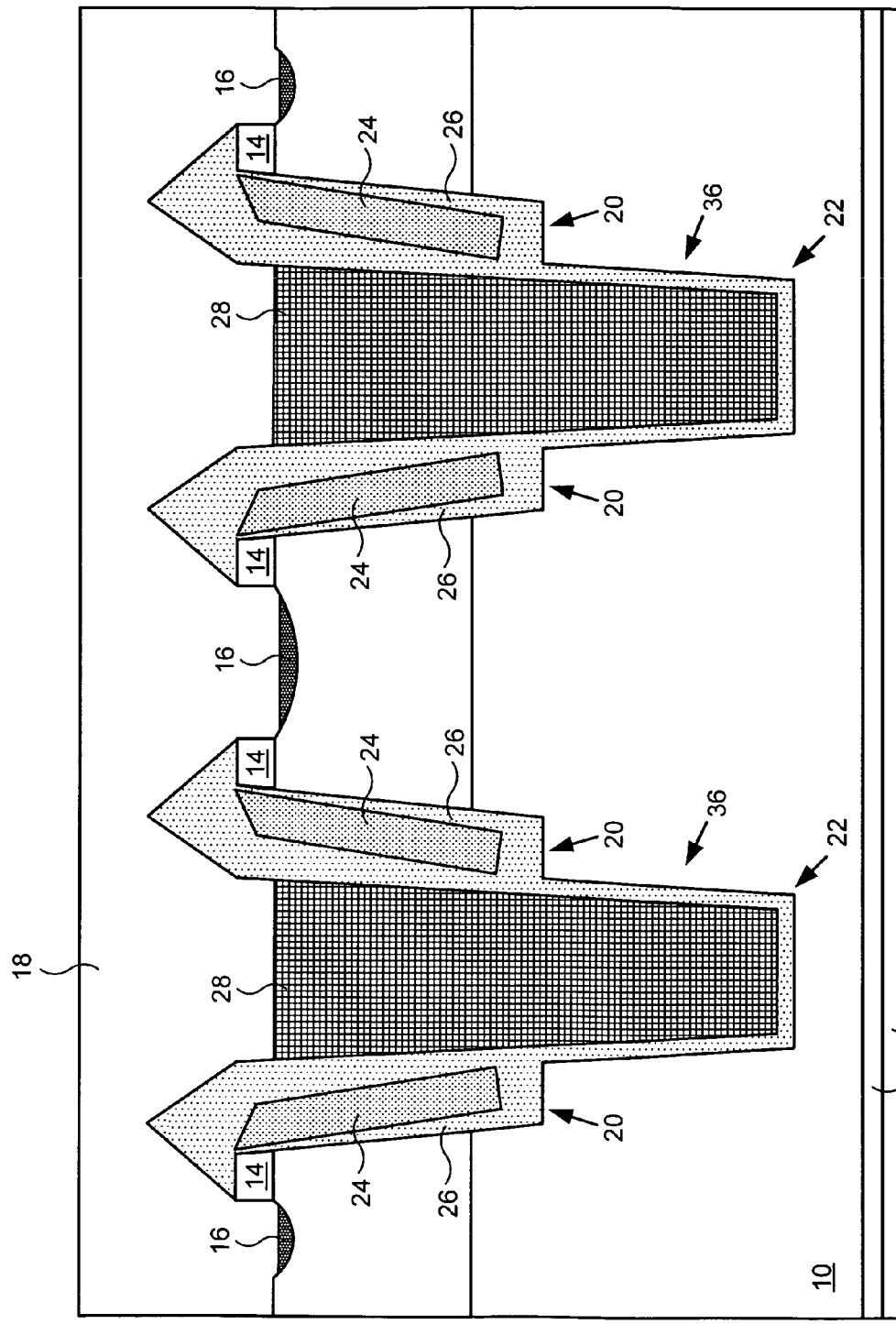
FIG. 2 illustrates a cross-sectional view of a power MOSFET fabricated according to the second embodiment.

Referring now to FIG. 2, in which like numerals identify like features, a power MOSFET according to the second embodiment includes all features of the first embodiment except that the bottom portion of trench 36 thereof includes sidewalls tapering toward the bottom thereof.

As a result, the bottom of the bottom portion of trench 36 is narrower than the top portion (the portion adjacent the top portion of trench 36) thereof.

Figure 3A:
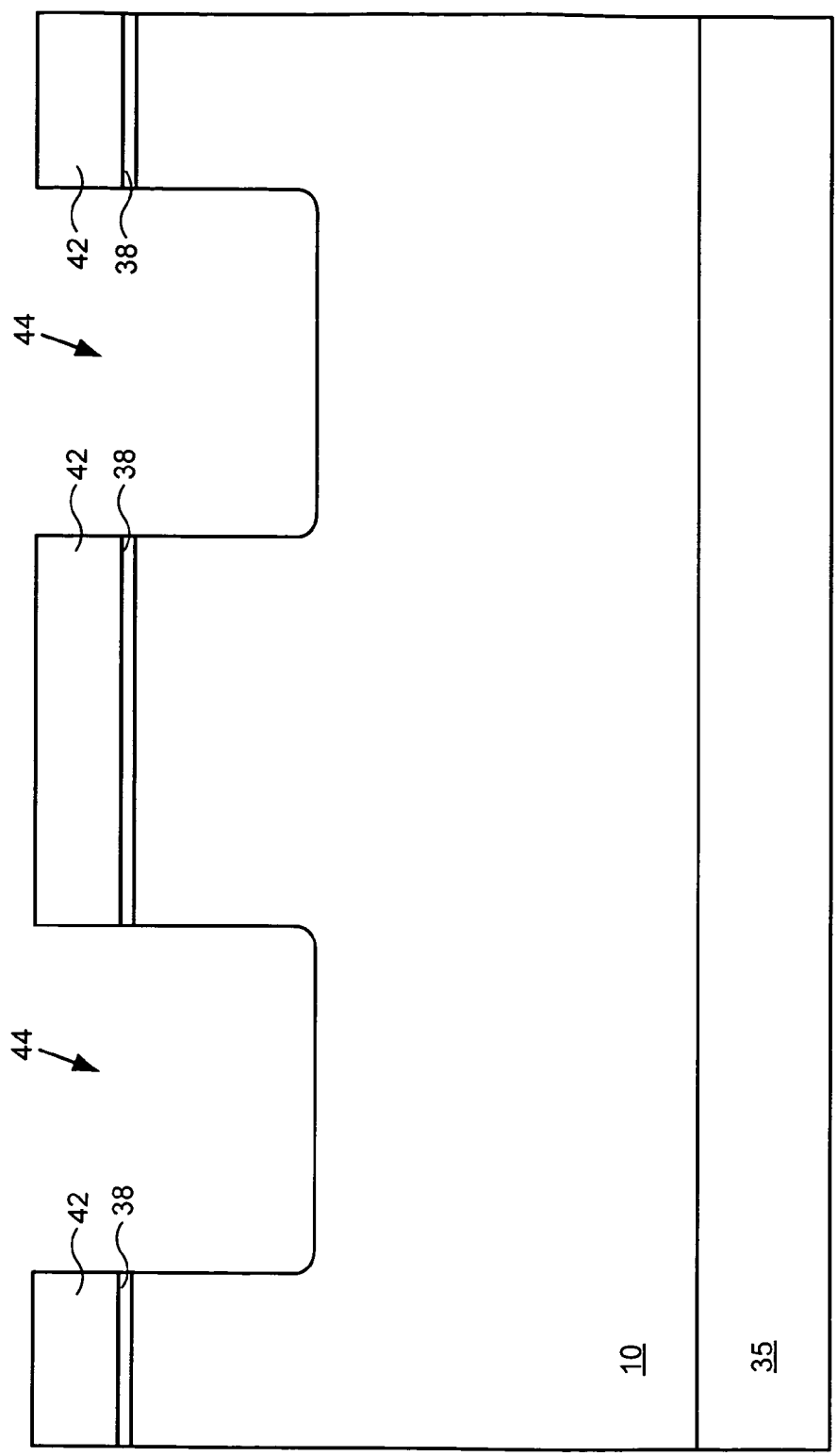
FIGS. 3A-3F illustrate steps in a method according to the first embodiment.
Figure 3B:
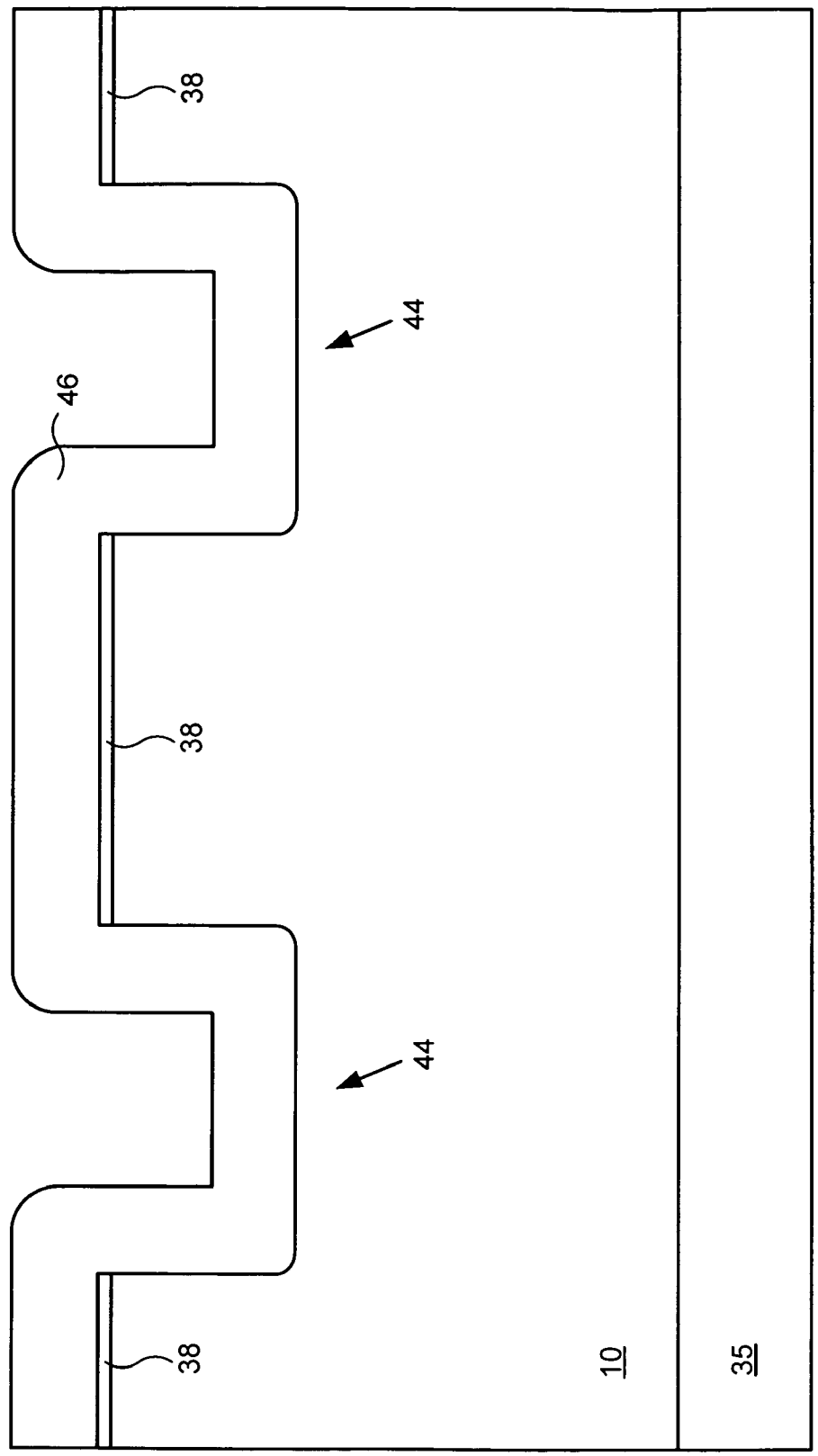
Figure 3C:
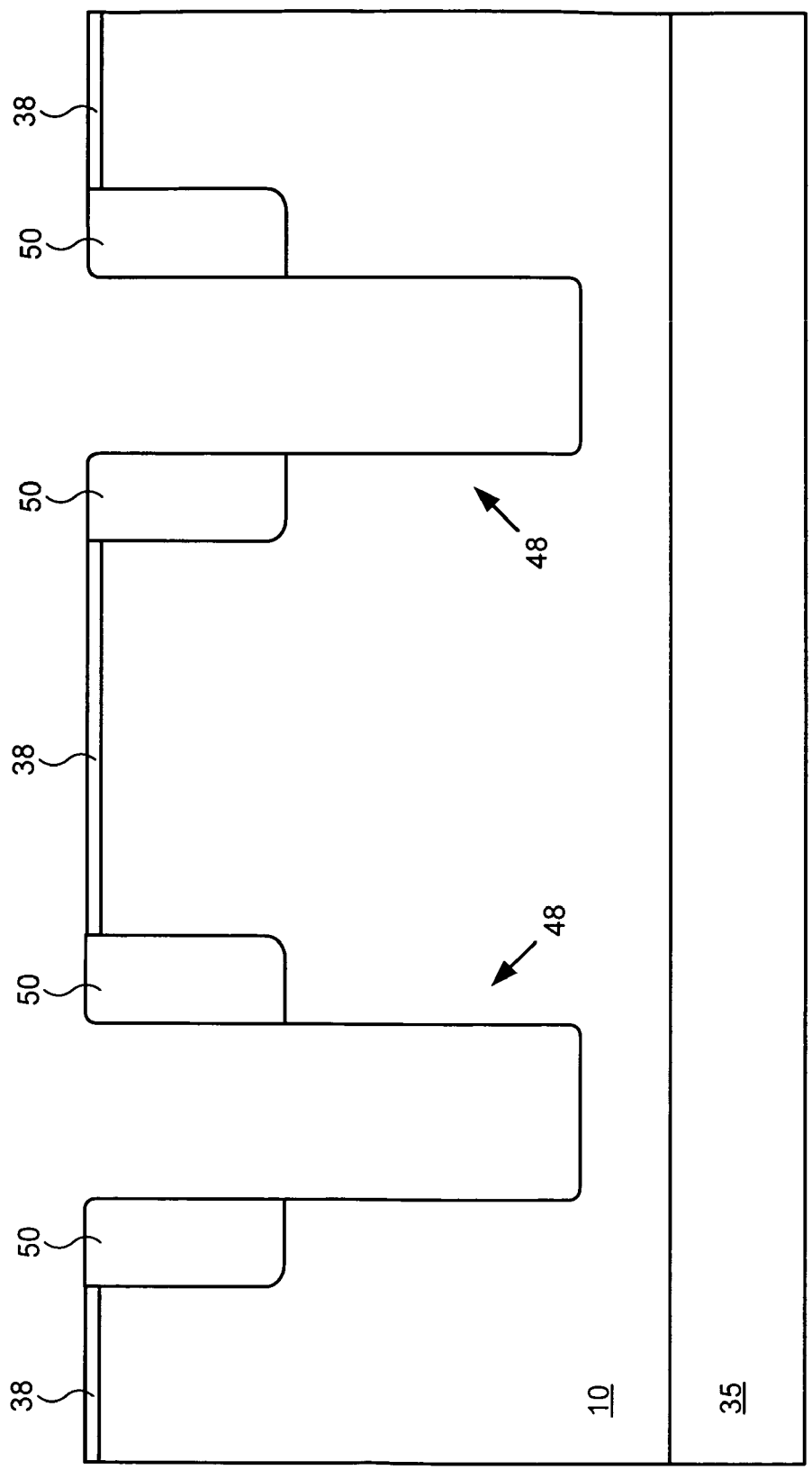

Referring to FIGS. 3A-3F, a device according to the first embodiment is fabricated by growing pad oxide 38 on a top surface of an N-type semiconductor body 10 (e.g. an epitaxially grown silicon body), depositing silicon nitride 42 atop pad oxide 38, patterning silicon nitride 42 to form a mask that includes openings over body 10 to designate areas for removal to obtain the top part of trenches 36, followed by removal of semiconductor material to obtain top part 44 of trench 36 (see FIG. 3A). Thereafter, silicon nitride mask 42 is removed, followed by deposition of a low density oxide (e.g. silicon dioxide deposited using a TEOS process) 46 or the like over pad oxide 38 and into top part 44 of trench 36 (see FIG. 3B). Next, low density oxide 46 is removed from atop pad oxide 38 and the bottom of top portion 44, and then semiconductor material is removed (e.g. through etching) from the bottom portion of top portion 44 to obtain bottom portion 48 of trench 36. Note that spaced low density oxide spacers 50 are left at the corners of top portion 44 of trench 36 (FIG. 3C) each extending along a sidewall from the bottom thereof.

Figure 3D:
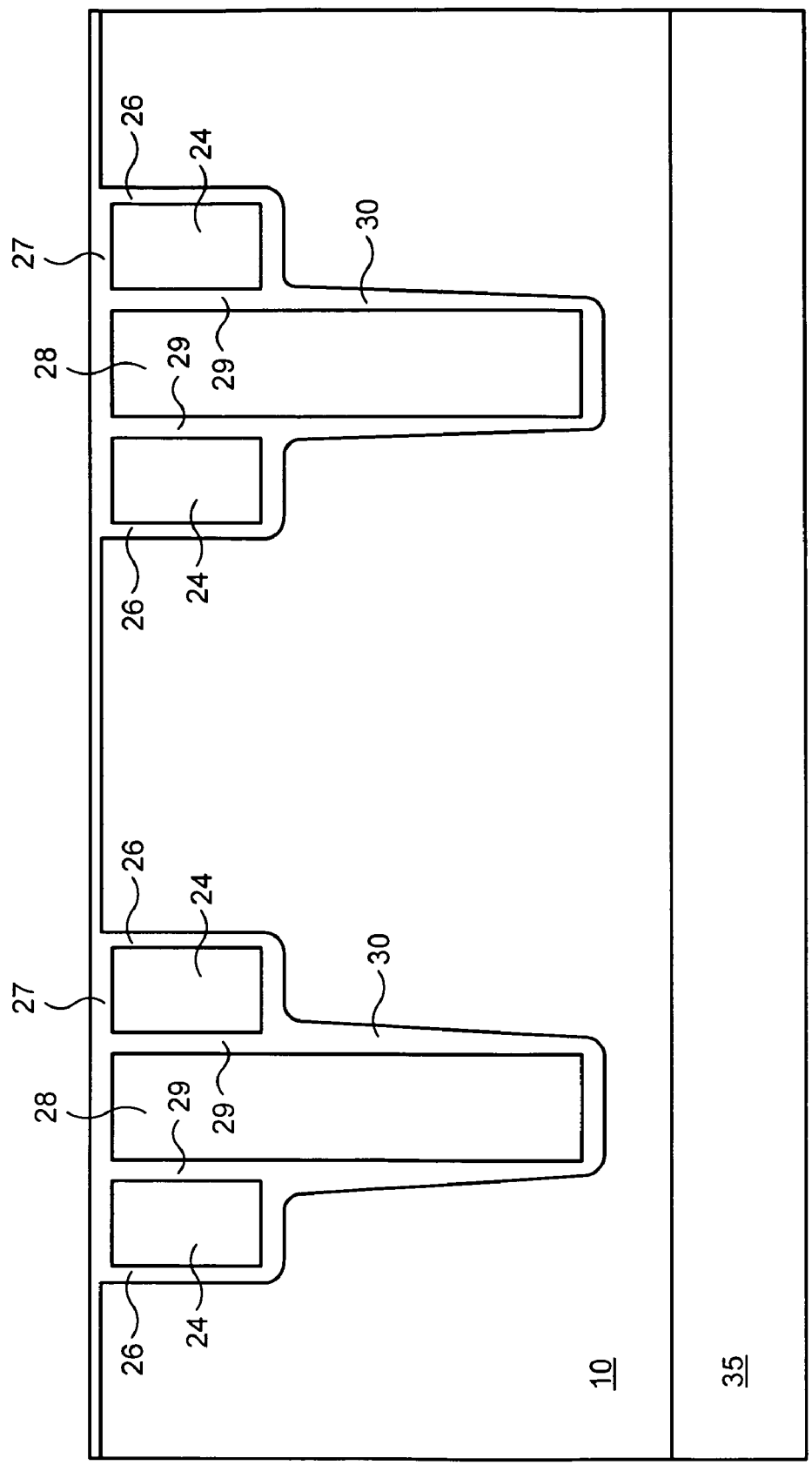
Figure 3E:
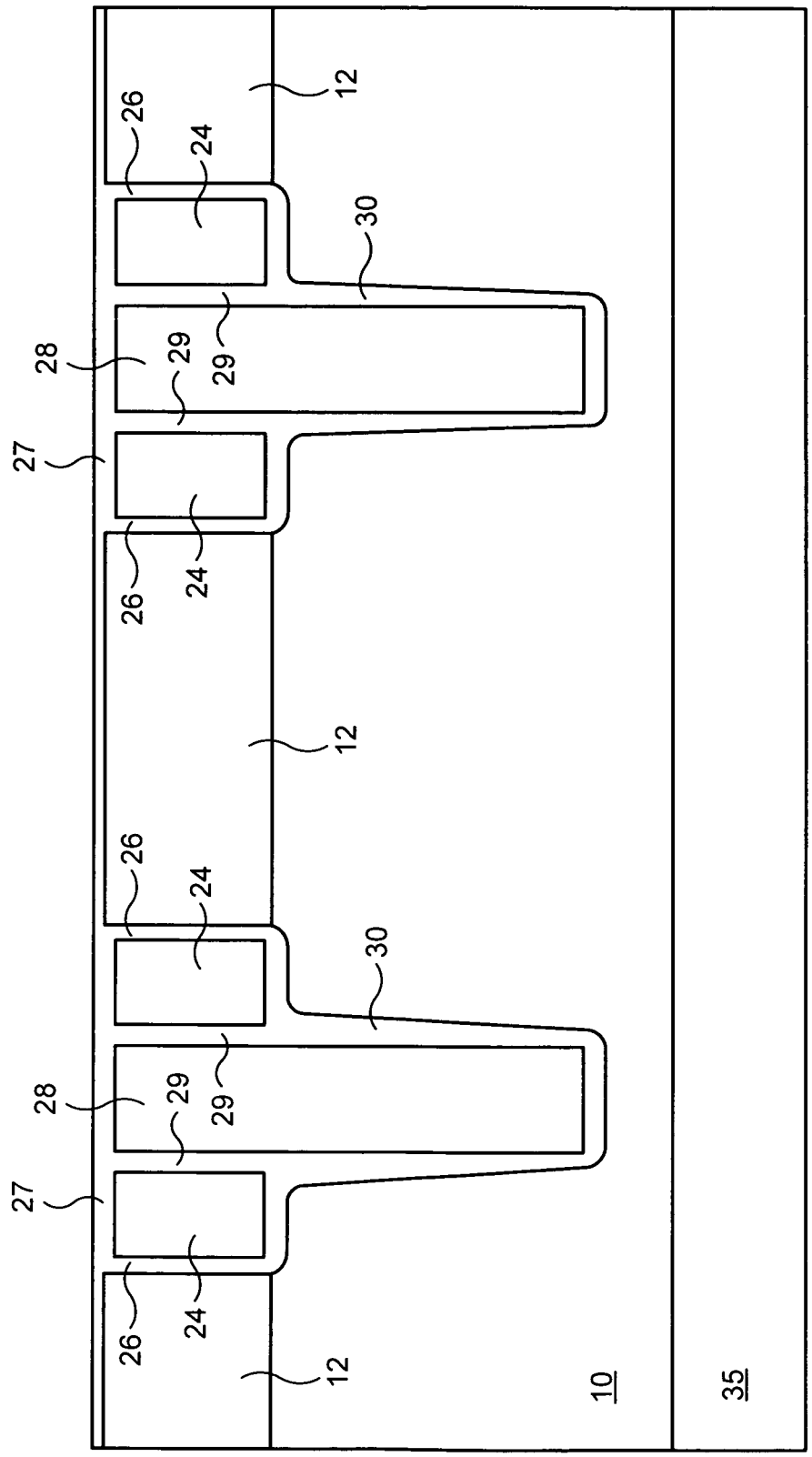

Referring now to FIG. 3D, to obtain the structure shown therein, oxide 30 (e.g. $SiO_2$ or any other suitable insulation) is deposited or grown inside bottom portion 48. Thereafter, the space remaining inside bottom portion 48 and between spacers 50 is filled with polysilicon and rendered conductive to obtain source field electrode 28. Each spacer 50 adjacent the sidewalls of top portion 44 is then removed (e.g. through etching) exposing sidewalls of portion 44 and side surfaces of source field electrode 28 inside portion 44. Thereafter, gate oxide 26 is grown on at least the sidewalls of portion 44. In the same step, polysilicon oxide 29 may be grown on the exposed surfaces of source field electrode 28. Next, polysilicon for gate electrodes 24 is deposited and rendered conductive in the space between gate oxide 26 and the polysilicon oxide 29 on each source field electrode 28 inside portion 44. Then, polysilicon oxide 27 or the like may be deposited or alternatively grown through an oxidation process to insulate at least the top portions of gate electrode 24 and source field electrode 28.

Figure 3F:
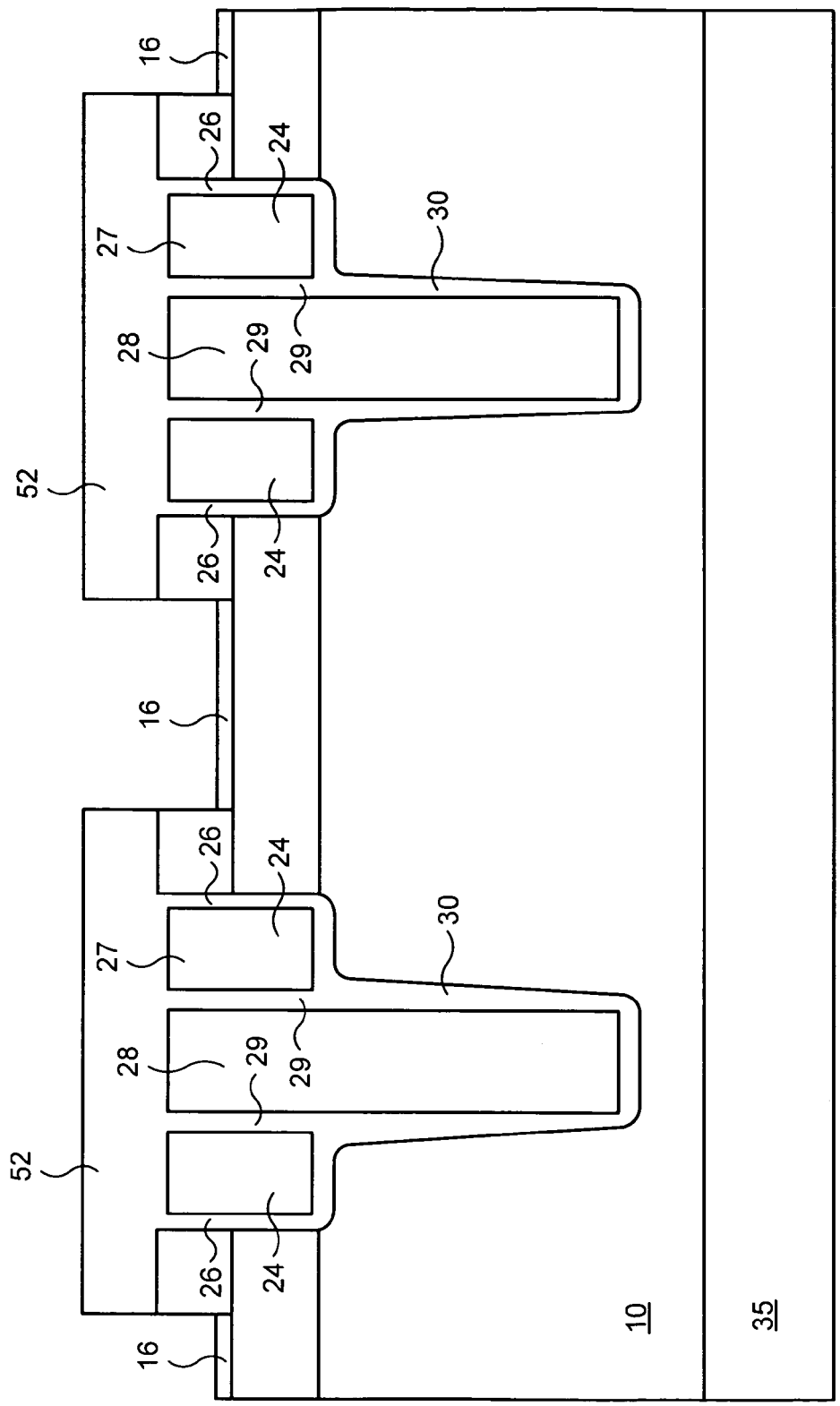

Thereafter, dopants for base region 12 are implanted and driven to obtain base region 12 (FIG. 3E), followed by source implantation, deposition and patterning of interlayer oxide layer 52 (which may be a low density silicon dioxide deposited through a TEOS process) over at least gate electrodes 24 and source field electrode 28. Thereafter, other suitable steps can be carried out to obtain high conductivity contact regions 16 (e.g. forming recesses through the source regions) (FIG. 3F). Source electrode 18 and drain electrode 34 are then formed by sputtering aluminum or the like in any suitable manner to obtain a device as illustrated by FIG. 1. Note that source electrode 18 is ohmically coupled to source field electrode 28 and thus the two would be at the same potential when the device is in operation.

Figure 4A:
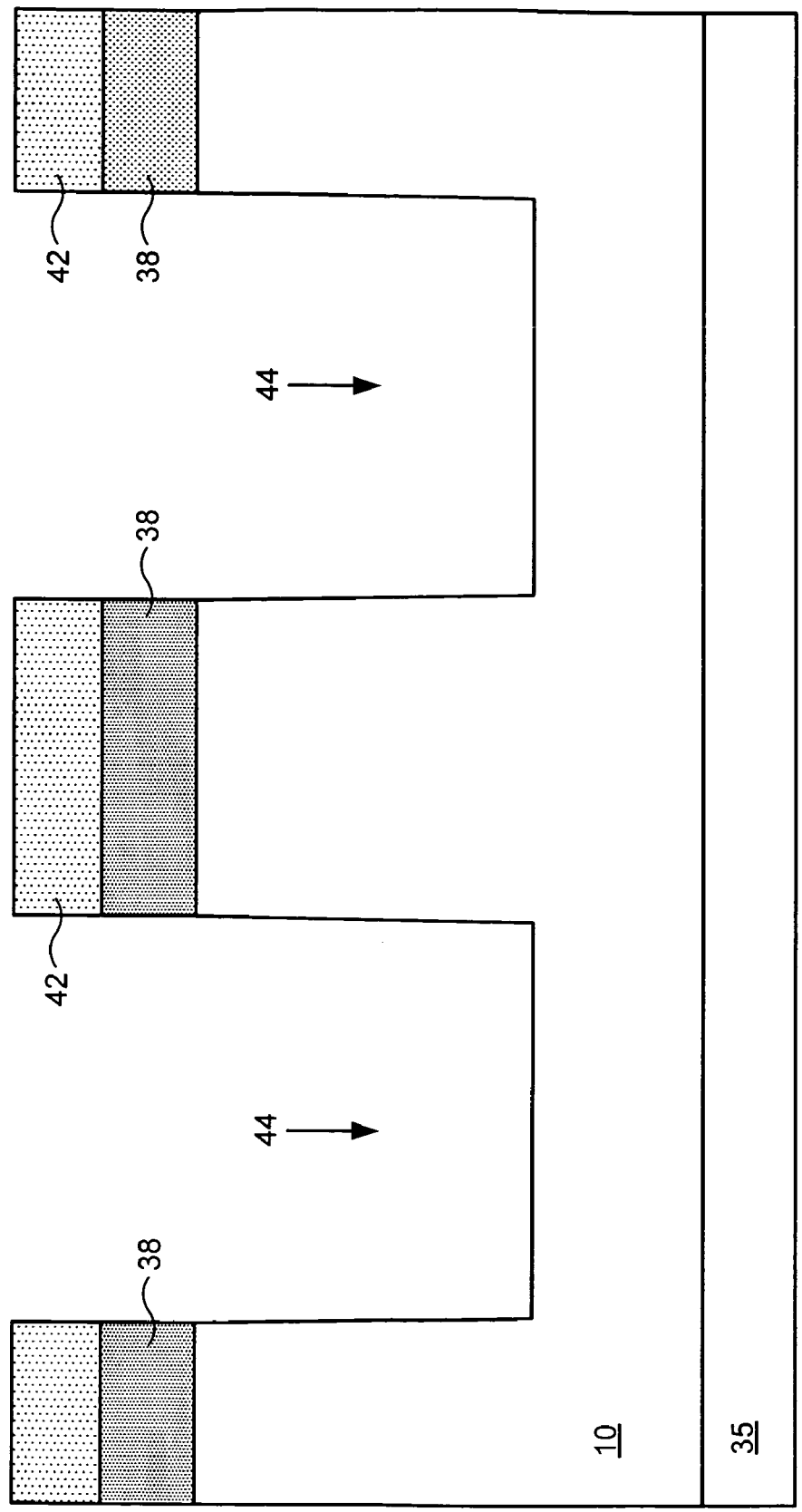
FIGS. 4A-4G illustrate steps in a method according to the second embodiment.
Figure 4B:
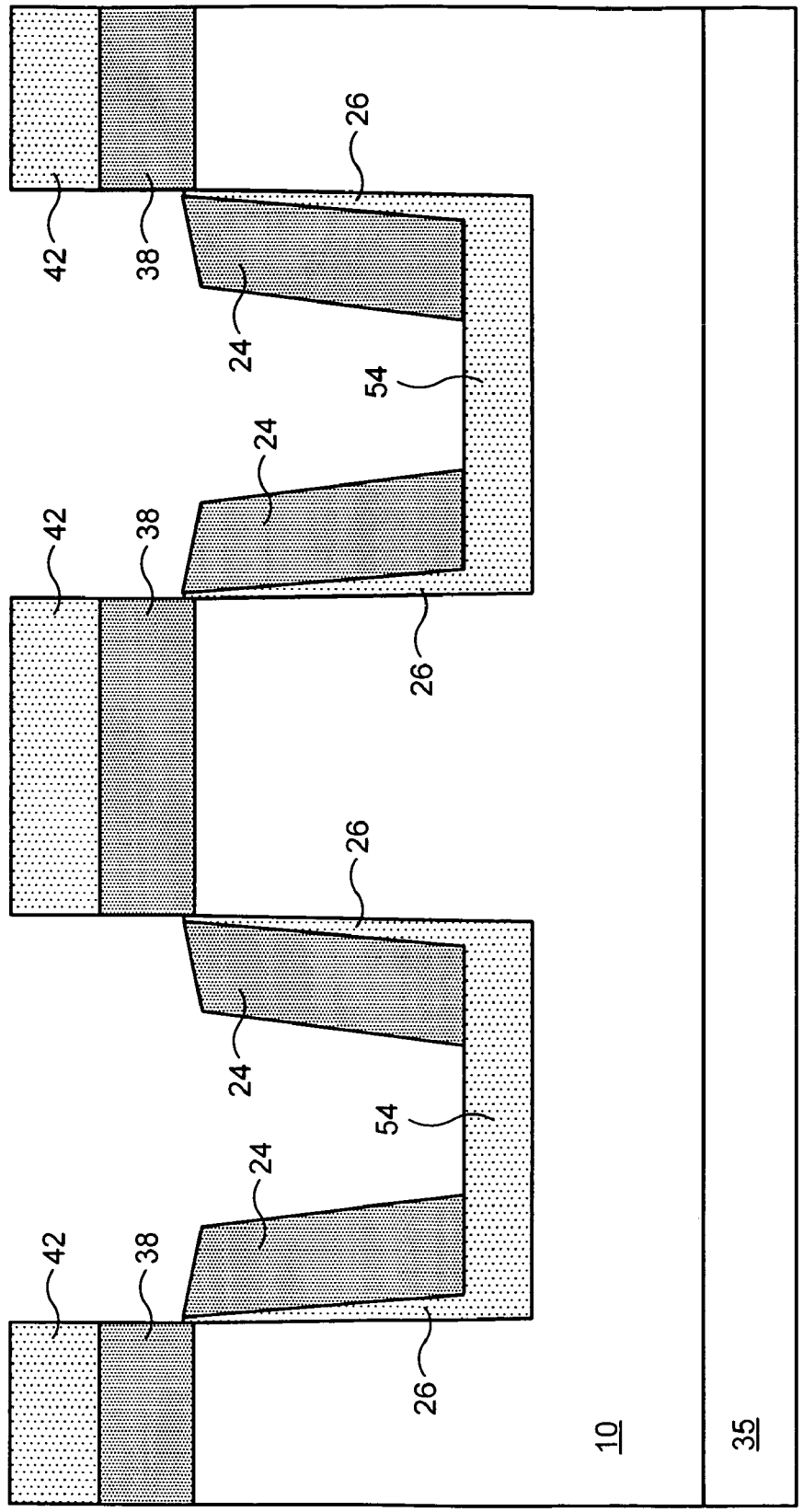
Figure 4C:
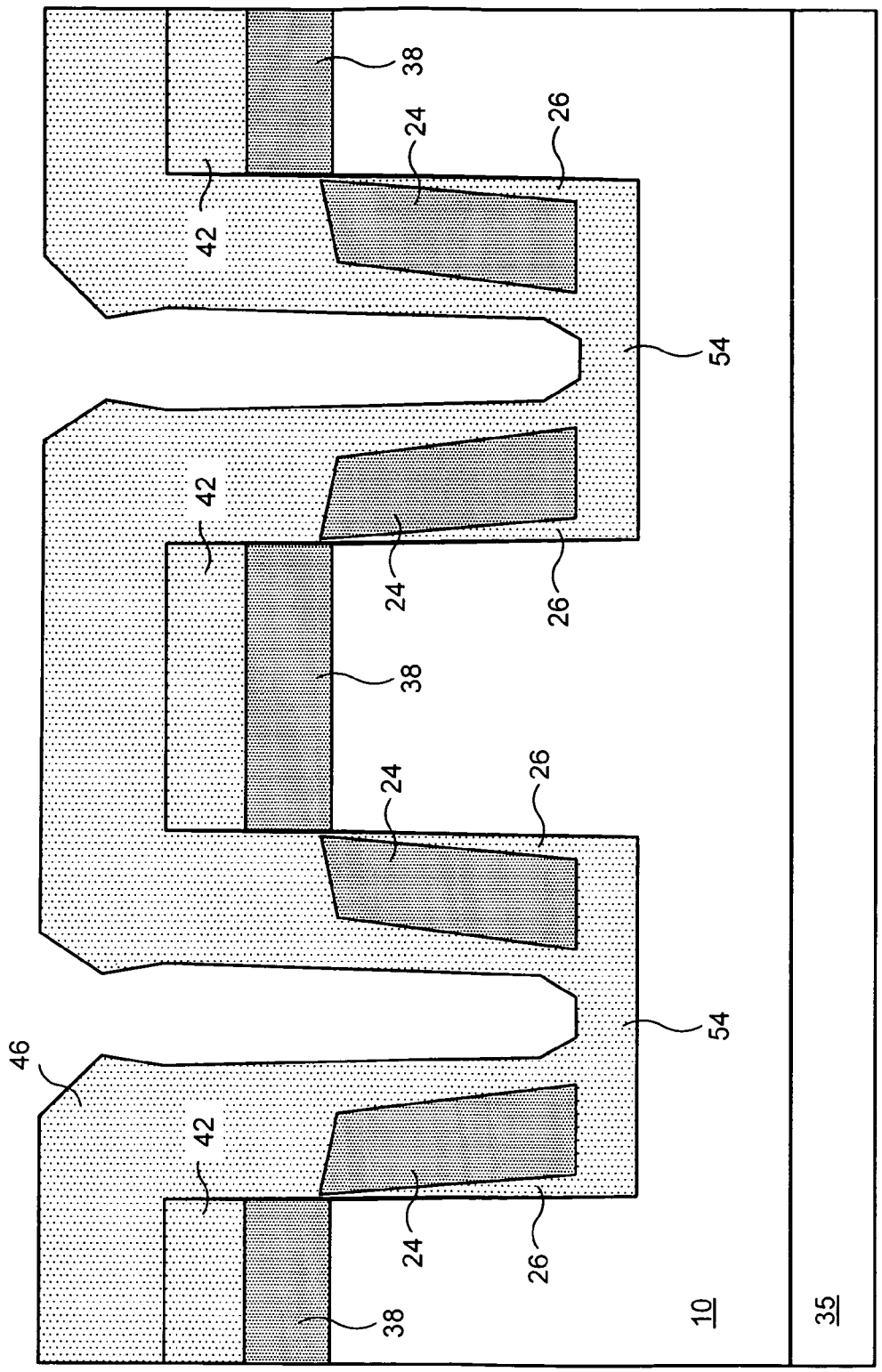

Referring to FIGS. 4A-4G, a device according to the second embodiment is fabricated by forming pad oxide 38 and silicon nitride 42 over a silicon body 10 followed by patterning of silicon nitride 42 and pad oxide 38 therebelow, and etching to obtain top portion 44 of trench 36 (FIG. 4A). Next, a bottom oxide 54 (e.g. $SiO_2$) is formed at the bottom of top portion 44 according to any suitable method. Gate oxide bodies 26 (e.g. $SiO_2$) are also grown on the sidewalls of top portion 44. Thereafter, polysilicon is deposited and etched to obtain gate electrodes 24 (FIG. 4B).

Figure 4D:
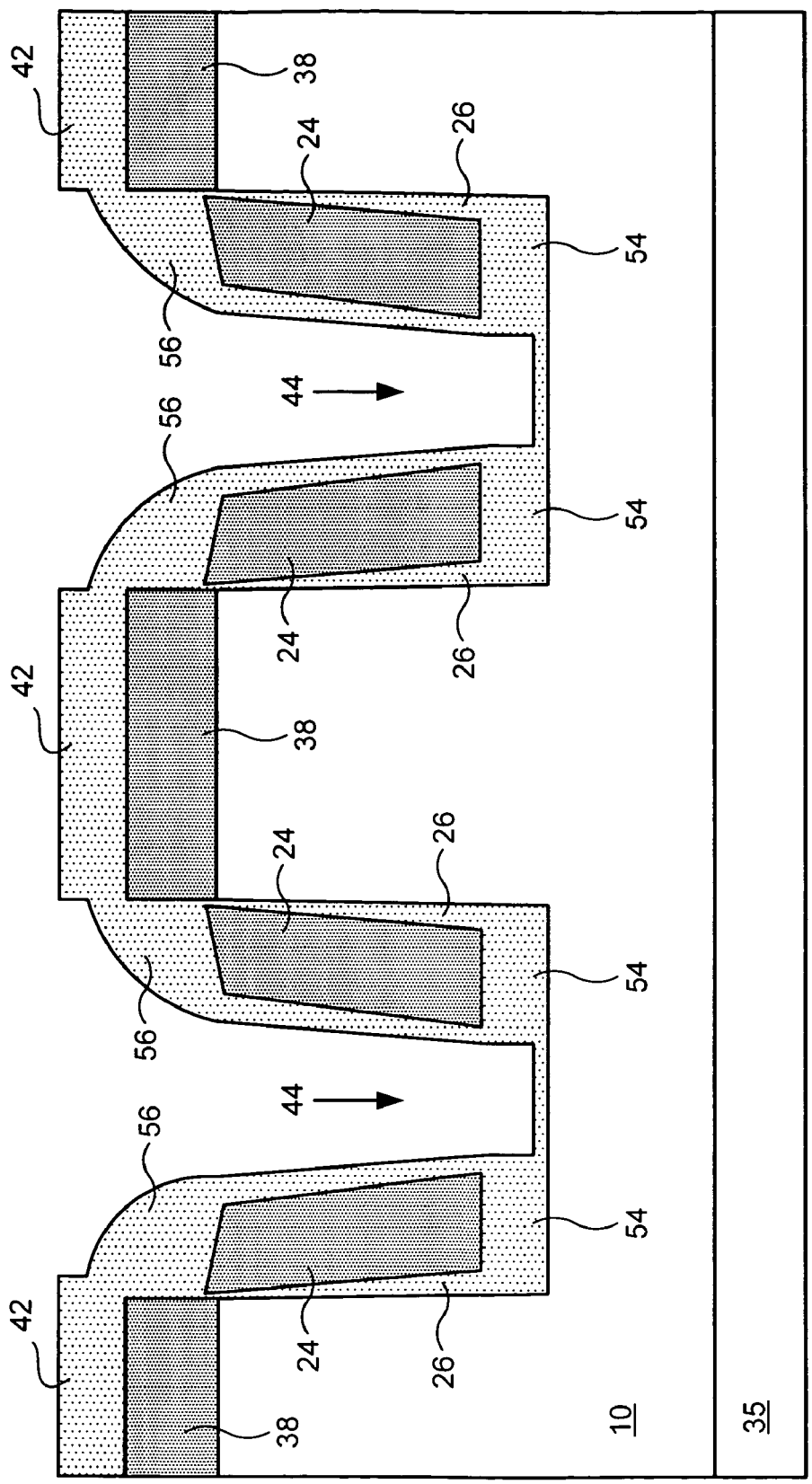
Figure 4E:
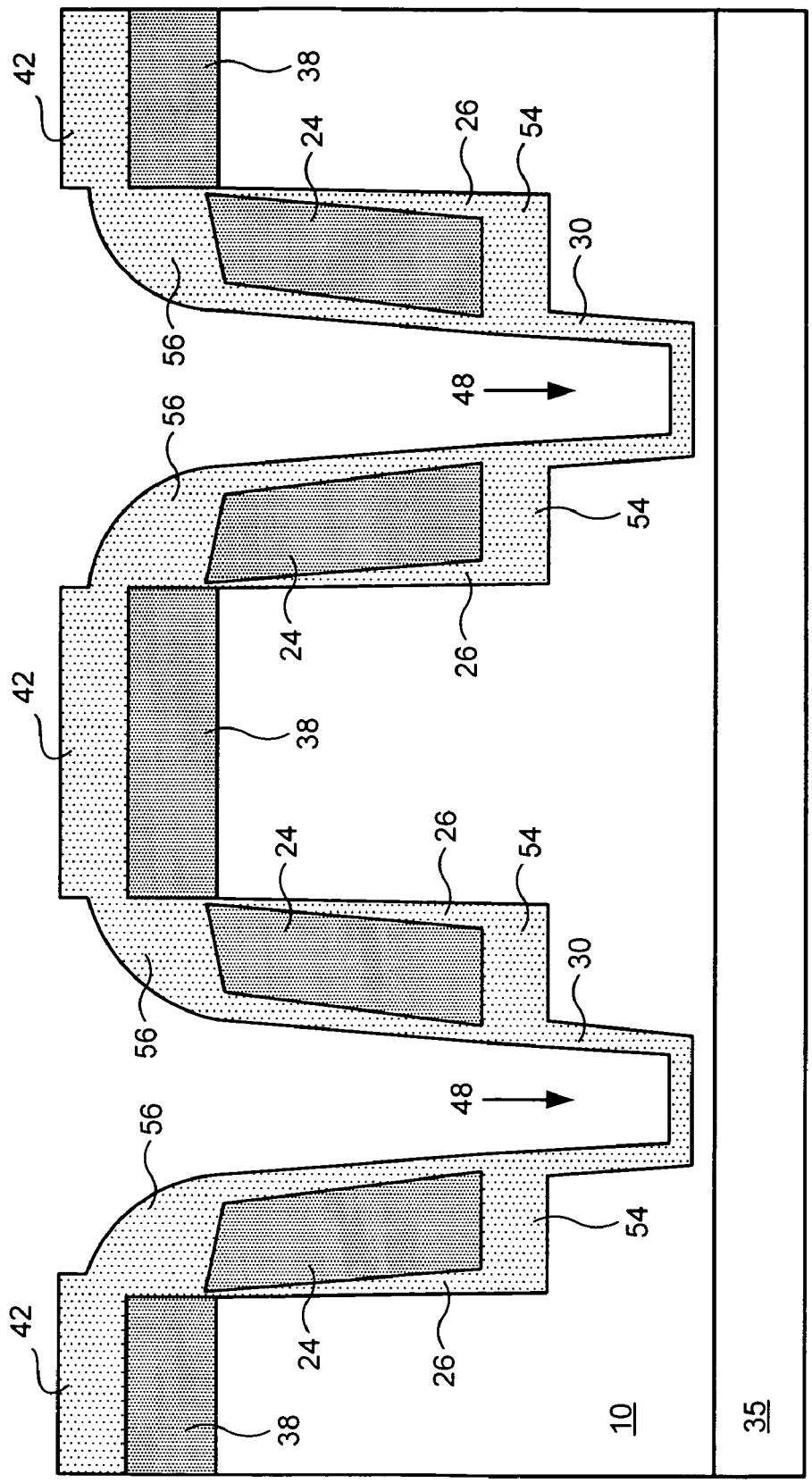

Next, TEOS 46 or the like is deposited over silicon nitride 42 and inside top portion 44 over gate electrodes 24 (FIG. 4C) and then etched back to obtain oxide insulation bodies 56 over the inside walls of gate electrodes 24 (FIG. 4D). Insulation bodies 56 are then used as a mask to remove a portion of bottom oxide 54 to designate the region to be removed to form the bottom portion of trench 36 (FIG. 4D). Thereafter, bottom portion 48 of trench 36 is formed through etching or the like. The sidewalls and the bottom of portion 48 are then oxidized (FIG. 4E).

Figure 4F:
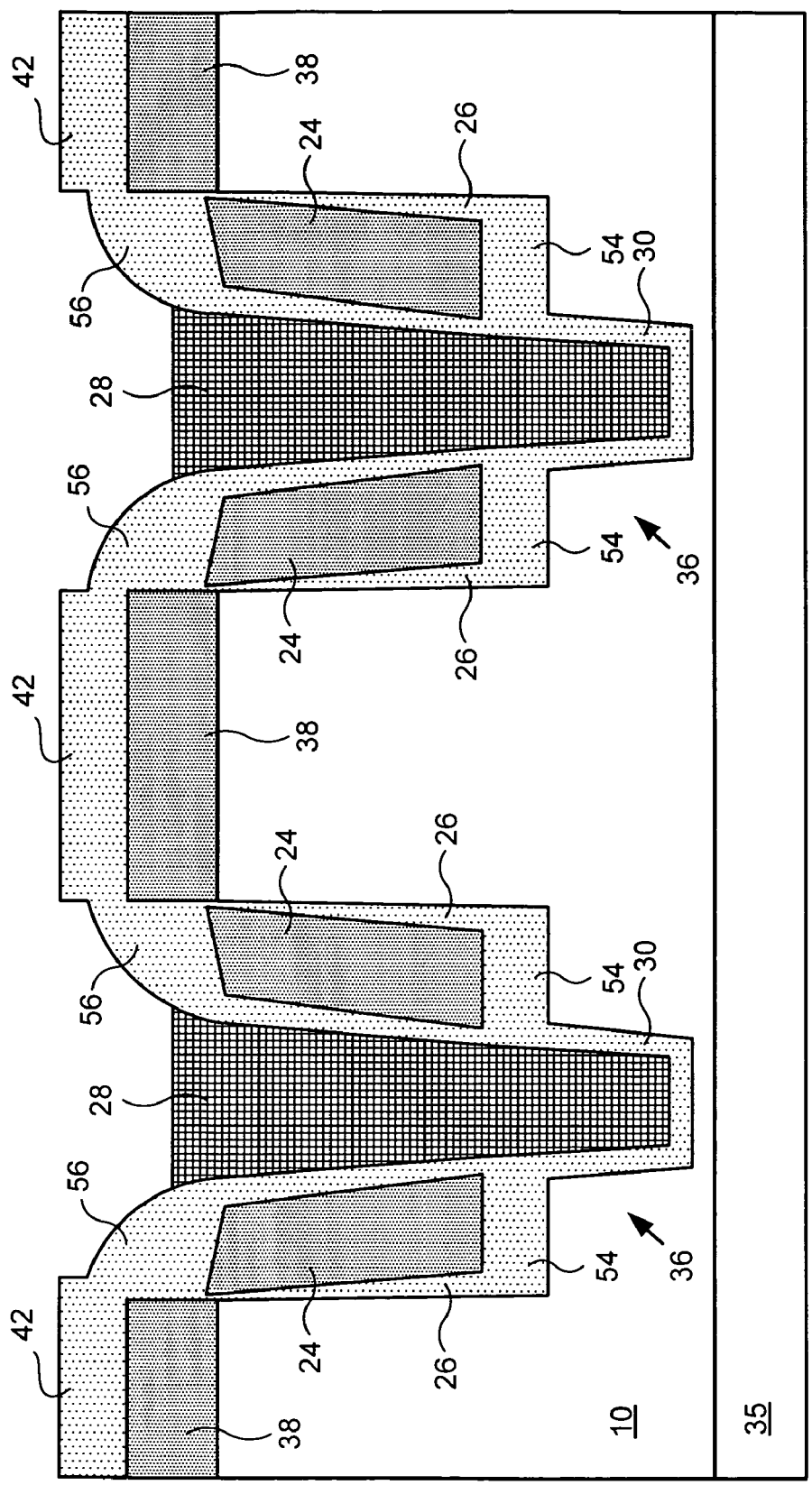
Figure 4G:
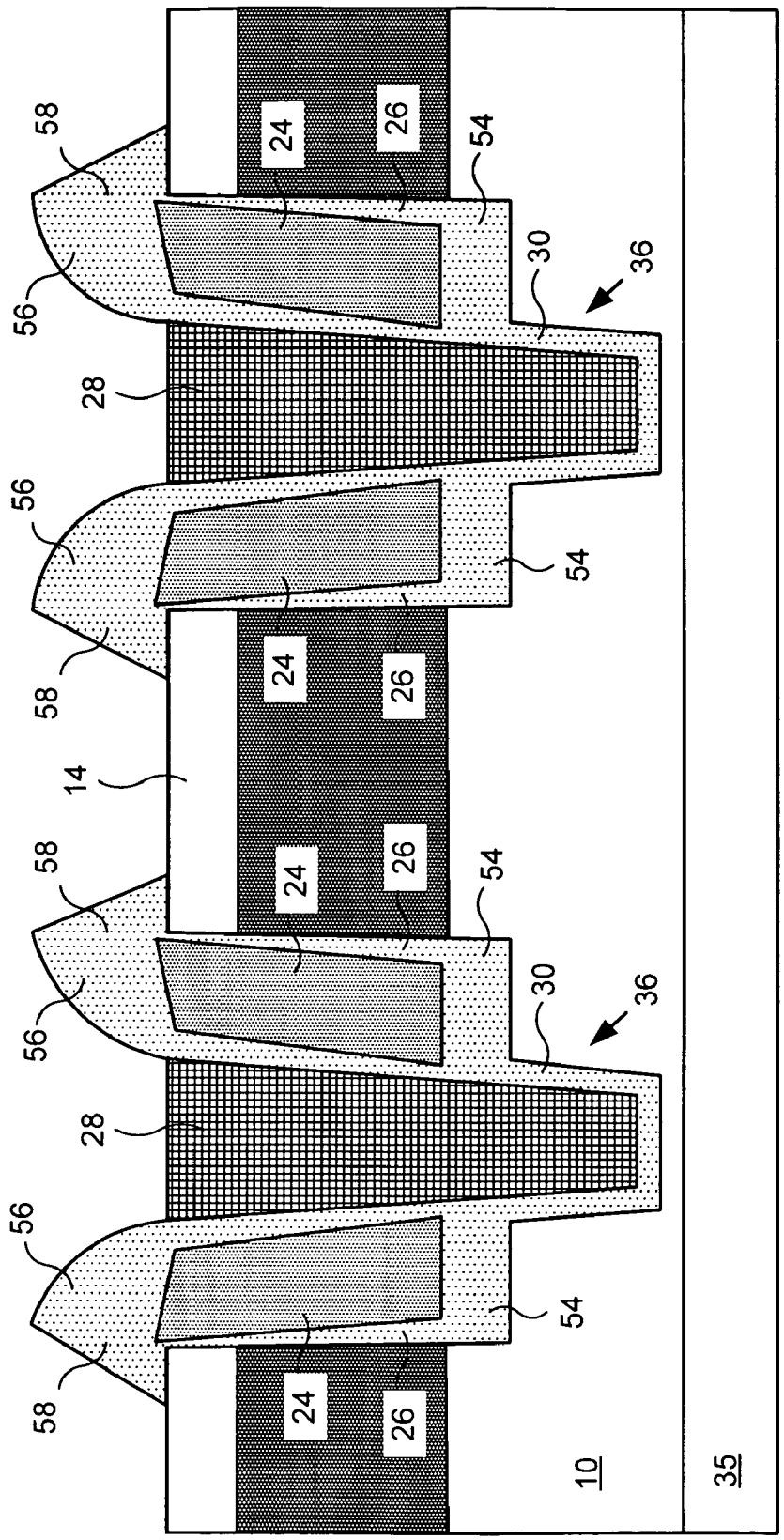

Next, source field electrode 28 is formed inside bottom portion 48 extending into top portion 44 through deposition of polysilicon and etching (FIG. 4F).

Thereafter, silicon nitride 42 is removed (etched back), dopants for forming base region 12 are implanted followed by dopants for forming source regions 14 followed by a drive step to obtain regions 12, 14. Oxide spacers 58 are then formed through oxide deposition over insulated gate electrodes and source filed electrode in each trench and then etched back. Note that the etch back allows access to the top of source field electrode 28. Thereafter, a recess is formed through source region 14 and high conductivity contact regions 16 are formed at the bottom of each recess. Source electrode 18 and drain electrode 34 are then applied using any suitable method to obtain a device according to the second embodiment.

It should be noted that preferably silicon dioxide body 30 in each embodiment is thicker than the silicon dioxide body that insulates the gate electrodes from the base region of the device.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for fabricating a semiconductor device comprising:

forming a first trench mask over one surface of a semiconductor body, said first trench mask including an opening therein;

removing semiconductor material from said semiconductor body from a bottom of said opening in said mask to obtain a first trench having a first width and extending to a first depth inside said semiconductor body, said first trench including sidewalls. and a bottom;

forming spacers inside said first trench, each spacer extending from said bottom of said first trench along a respective sidewall thereof, said spacers being spaced from one another at said bottom of said first trench;

removing semiconductor from said bottom of said first trench using said spacers as a second trench mask to obtain a second trench having a second width and extending to a second depth below said first depth inside said semiconductor body, said second width being less than said first width, said second trench including sidewalls and a bottom;

covering said sidewalls and said bottom of said second trench with an insulation body;

forming a field electrode inside said second trench, said source field electrode extending into said first trench; and depositing an oxide layer over said source field electrode, said spacers and said first trench.

2. The method of claim 1, wherein said spacers are comprised of silicon dioxide.

3. The method of claim 1, wherein said spacers are comprised of insulated gate electrodes.

4. The method of claim 1, further comprising removing said spacers, and then forming an insulated gate between said source field electrode and a respective sidewall of said first trench.

5. The method of claim 1, wherein said sidewalls of said second trench are vertically oriented.

6. The method of claim 1, wherein said sidewalls of said second trench taper toward said bottom of said second trench.

7. The method of claim 1, wherein said first trench mask comprises silicon nitride.

8. The method of claim I, wherein said forming said spacers inside said first trench comprises depositing silicon dioxide inside said first trench to cover said bottom and said sidewalls thereof, and removing a portion of said silicon dioxide that lies over said bottom of said first trench to obtain spacers that are spaced at said bottom of said first trench.

9. The method of claim 1, wherein said forming said spacers inside said first trench comprises oxidizing said sidewalls of said first trench, forming spaced polysilicon gate electrodes inside said first trench along said oxidized sidewalls thereof.

10. The method of claim 1, wherein said covering step comprises oxidizing said sidewalls and said bottom of said second trench.

11. The method of claim 1, wherein said covering step comprises depositing an insulation body on said sidewalls and said bottom of said second trench.

12. A method for fabricating a semiconductor device comprising:
   etching a first trench into a semiconductor body using a trench mask;
   etching a second trench into a bottom of said first trench by forming spacers within said first trench, each spacer extending along a respective sidewall thereof and being used as a second trench mask;
   filling said second trench with an insulated source field electrode, said source field electrode extending vertically into said first trench; and
   removing said spacers and forming therein insulated gate electrodes by depositing a gate oxide and filling with a polysilicon gate electrode.

13. The method of claim 12, wherein said spacers are comprised of silicon dioxide.

14. The method of claim 12, wherein the sidewalls of said second trench are vertically oriented.

15. The method of claim 12, wherein the sidewalls of said second trench taper toward the bottom of said second trench.

16. The method of claim 12, wherein said forming said spacers inside said first trench comprises depositing silicon dioxide inside said first trench to cover the bottom and sidewalls thereof to obtain spacers that are spaced at said bottom of said first trench.

* * * * *

UNITED STATES PATENT AND TRADEMARK OFFICE
CERTIFICATE OF CORRECTION

| | | |
|---|---|---|
| PATENT NO. | : 7,998,808 B2 | Page 1 of 1 |
| APPLICATION NO. | : 12/409077 | |
| DATED | : August 16, 2011 | |
| INVENTOR(S) | : Viswanathan et al. | |

It is certified that error appears in the above-identified patent and that said Letters Patent is hereby corrected as shown below:

In the claims, column 4, line 49, "sidewalls." should be changed to --sidewalls--.

In the claims, column 5, line 15, "claim I" should be changed to --claim 1--.

Signed and Sealed this

Thirteenth Day of December, 2011

David J. Kappos
*Director of the United States Patent and Trademark Office*